(12) United States Patent
Dayley

(10) Patent No.: US 6,661,648 B2
(45) Date of Patent: Dec. 9, 2003

(54) MODULAR PROCESSOR BASED APPARATUS

(75) Inventor: J Don Dayley, Meridian, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/898,647

(22) Filed: Jul. 3, 2001

(65) Prior Publication Data

US 2003/0007321 A1 Jan. 9, 2003

(51) Int. Cl.[7] .............................................. G06F 1/16
(52) U.S. Cl. ........................................ 361/683; 361/686
(58) Field of Search ................................. 361/683, 686

(56) References Cited

U.S. PATENT DOCUMENTS

| | | | | |
|---|---|---|---|---|
| 4,773,868 A | * | 9/1988 | Heinecke | ..................... 439/69 |
| 5,552,959 A | * | 9/1996 | Penniman et al. | ........... 361/686 |
| 5,602,721 A | * | 2/1997 | Slade et al. | .................. 361/727 |
| 5,793,998 A | * | 8/1998 | Copeland et al. | ............ 395/309 |
| 5,936,609 A | * | 8/1999 | Matsuoka et al. | ........... 345/156 |
| 6,144,888 A | * | 11/2000 | Lucas et al. | ................... 700/83 |

* cited by examiner

Primary Examiner—Darren Schuberg
Assistant Examiner—Yean Hsi Chang

(57) ABSTRACT

A modular processor based system has a plurality of interchangeable modular components with power and communications connection means on top and bottom walls whereby the components may be operably connected to one another through vertical stacking. Modular components preferably include a processor, printer, memory, network communications, and hard drive components. Preferred connectors are mating male and female connectors on module top and bottom walls. The modular system of the invention provides important space saving and ease of connection advantages through its modular, stacked configuration.

19 Claims, 6 Drawing Sheets

MODULAR PROCESSOR BASED APPARATUS

FIELD OF THE INVENTION

The present invention is related to computers and peripherals. More particularly, the present invention is related to a modular processor based system operably connected to one another through stacking.

BACKGROUND OF THE INVENTION

In the late 1970's and early 1980's so called "personal computers" became commercially available. This began a trend that brought computers to new consumer and business markets that historically did not have the expertise or financial resources to use computers. Operating systems such as Microsoft's Windows and Apple's Macintosh made computers relatively easy to use for even those with minimal or no computer training. By the early 1990's personal computers were widely used by consumers in homes, students, and in a broad spectrum of workplace environments.

Applications and peripheral devices for use with computers have likewise greatly expanded since the introduction of the personal computer. Typewriter use has dwindled as the vast majority of documents are currently created with word processor software running on a computer connected to a printer. Scanners are widely used to obtain digital images of documents for manipulation, reproduction, and the like. Vast amounts of information are now stored and transferred purely in digital form over data networks between computers via modems or other communications peripherals. Computers are increasingly becoming vehicles for entertainment based multi-media presentations with peripherals such as sound cards for speakers, digital video players, and the like.

The rapid and widespread adoption of personal computers and corresponding peripherals has not occurred without problems. As an example, users are often faced with set-up and installation problems. This has become acute as widespread computer use has penetrated a market of users not particularly skilled in their use. By way of example, problems associated with properly connecting peripherals like printers, scanners, and the like to a computer are common. Also, each peripheral generally requires a power cable for connection to a power source and a communications cable for connection to the computer. All of this cabling, particularly when multiple peripherals are present, may prove cumbersome, disorganized, and unattractive.

Additionally, as the number of peripherals used with computers has increased, space problems have arisen. Personal computer users that have a printer, scanner, and an external CD read/writer, for example, may be hard-pressed to place all of this equipment on a desktop.

Other problems in the art, in addition to those associated with required space, cabling and connection, and required computer knowledge remain unresolved. In particular, rapid change of technology has led to quick obsolence of computer systems and peripherals. Moore's Law, named for Intel Corporation co-founder Gordon Moore, predicts that processing power will approximately double every 18 months. Since the mid-1960's Moore's law has held approximately true, resulting in rapidly changing computer systems and peripherals. Developers have taken advantage of quickly advancing processor power by constantly creating applications that take advantage of the most recently available and powerful processors.

As a result, personal computers and peripherals have a rapid obsolescence. Purchasers of personal computer systems may find that within a year or two the system they bought is no longer able to run the latest applications. To add resources, the user may be required to upgrade the system by adding storage capacity, memory, a new video card, a new sound card, a new modem, or even a new central processor unit. While these changes are possible, they typically involve dealing with the inner circuitry of a computer and installing and/or removing chips, cards, or the like. This requires a level of computer knowledge and skill that is beyond many users.

These and other problems remain unresolved in the art.

SUMMARY OF THE INVENTION

The present invention is directed to a modular processor based apparatus comprising at least a processor module and a plurality of stackable components. Each of the stackable components has mating communications connectors on top and bottom walls, and at least one of the plurality of components has a communications connector for connecting to a communications port on the processor module. When vertically stacked with one another and with the processor module, the components are thereby operably connected to one another and to the processor module without requiring any cables or the like. In one embodiment of the computer system of the invention, the components further comprise mating structural and power connectors on top and bottom walls, with at least one of the components having a power connector for mating connection to a power connector on the processor module.

Components preferably comprise a monitor component, a printer component, a hard drive component, a memory component, a scanner component, an external drive component, and a sound card component. One embodiment of a monitor component of the computer system of the invention comprises a stackable monitor component. A second monitor embodiment comprises a stackable video card component that has a vertical support arm, with a monitor movably held on the support arm.

The modular computer system of the present invention solves many otherwise unresolved problems in the art. For example, the modular system has a relatively small "footprint" with its stacked vertical configuration, and thereby reduces required space for computers and attached peripherals over many systems of the prior art. In addition, communications and power connections are achieved through the mating connectors on component top and bottom walls that are joined through stacking of the components, without requiring external cabling or proper selection of connection ports. Further, many of the functional elements of the computer and peripheral system are physically separated from one another in modular components that are easily replaced for upgrade or repair purposes.

The above brief description sets forth rather broadly some of the more important features and advantages of the present disclosure so that the detailed description that follows may be better understood, and so that the present contributions to the art may be better appreciated. There are, of course, additional features of the disclosure that will be described hereinafter that form the subject matter of the claims appended hereto. In this respect, before explaining the embodiment of the disclosure in detail, it is to be understood that the disclosure is not limited in its application to the details set forth in the following description or illustrated in the drawings. The present invention may provide additional

DETAILED DESCRIPTION

Figure 1:
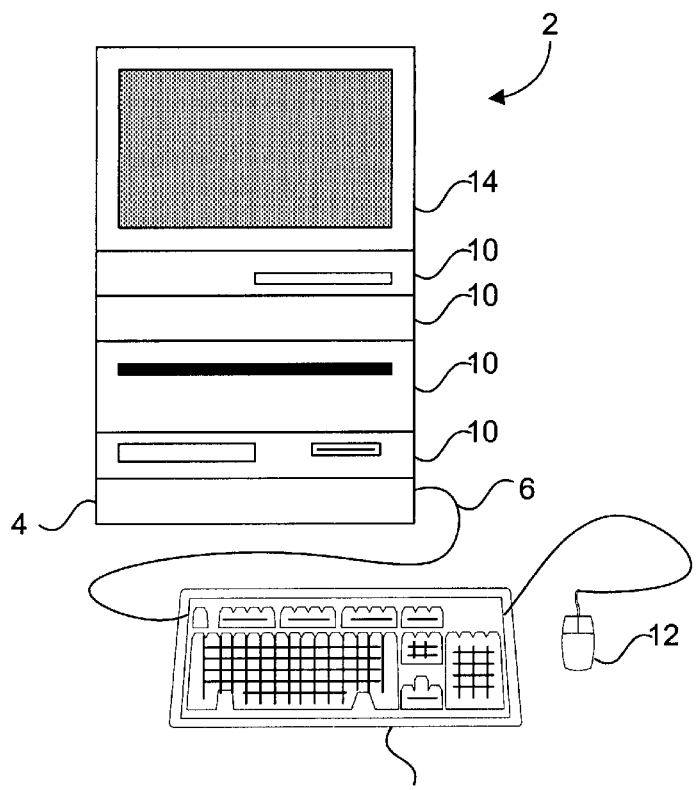
FIG. 1 is an elevational view of one embodiment of a modular computer system of the invention.
Figure 2:
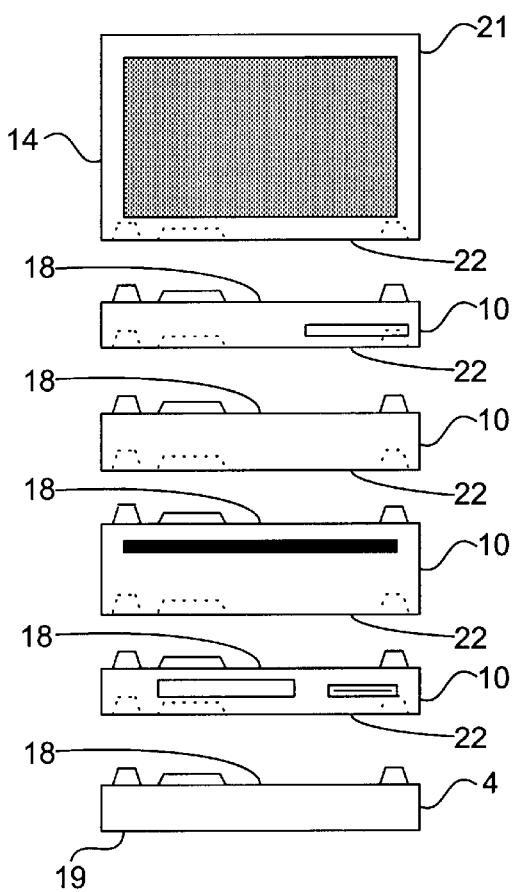
FIG. 2 is an exploded elevational view of the modular computer embodiment of FIG. 1.
Figure 3:
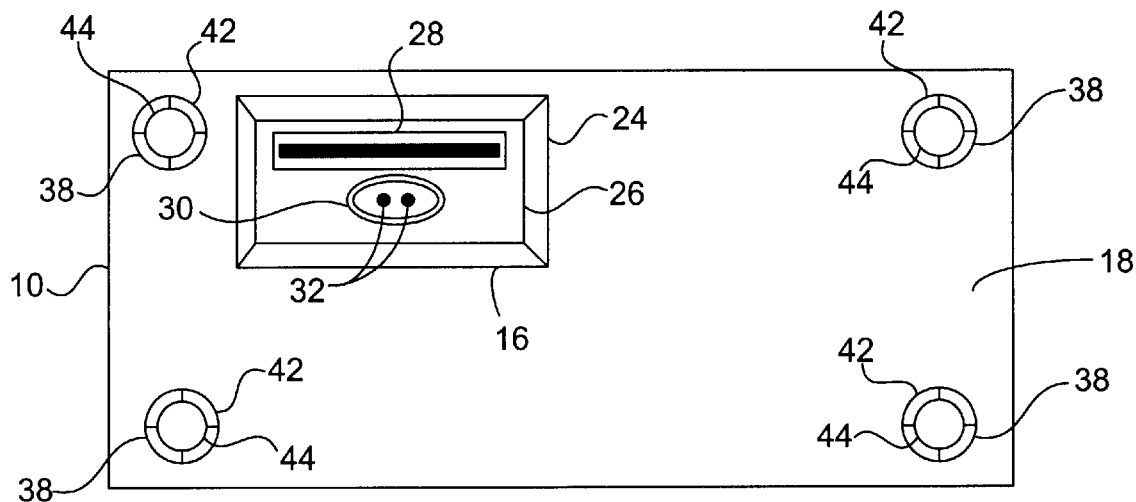
FIG. 3 is a top plan view of one of the stackable components of the modular computer embodiment of FIG. 1.
Figure 4:
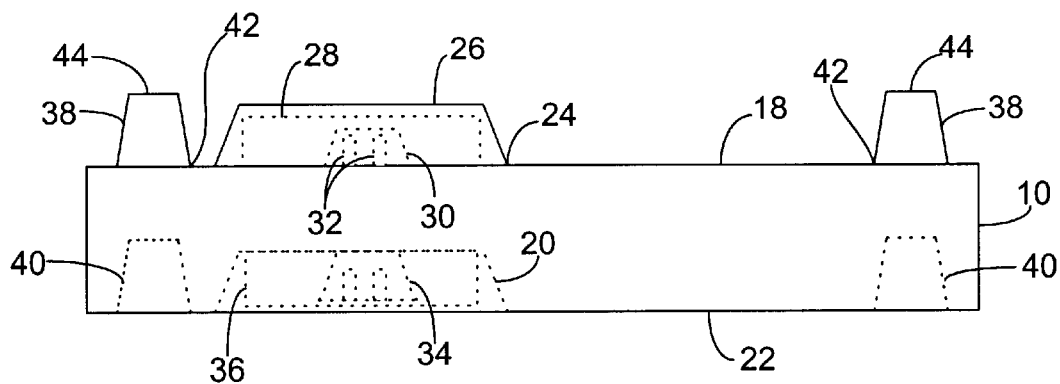
FIG. 4 is a front elevational view of the stackable component of FIG. 3.

Turning now to the drawings, FIG. 1 is a front elevational view of one embodiment of a modular computer system 2 of the invention, while FIG. 2 is an exploded front elevational view of the first embodiment. FIGS. 3–4 illustrate a top plan view and a front elevational view, respectively, of one of the components of the system embodiment of FIGS. 1–2. The system generally comprises a processor module 4, a plurality of stackable components 10, and a monitor unit 14, all of which are vertically stacked with one another. A keyboard 8 and a mouse 12 are connected by the cable 6 to a port on the processor module 4.

As shown in FIGS. 2–4, each of the stackable components 10 and the processor module 4 have a male connector member 16 on a component top wall 18 with a corresponding female cavity 20 (shown in dashed in FIGS. 2 and 4) on the bottom wall 22 for receiving the male connector member 16. Likewise, the top wall 18 has a plurality of male structural connectors 38, with mating female receptacles 40 for receiving the connectors 38. It is noted that although the stackable components 10 may differ in appearance and function from one another, their top and bottom walls are substantially identical to one another. Discussion of the various features of these top and bottom walls with reference to FIGS. 3–4 herein will thereby be understood to apply to all stackable components 10.

In addition, the modular computer system 2 as illustrated in FIGS. 1–2 shows the processor module 4 as underlying the stacked components 10, and the monitor 14 as stacked on top of the components 10. In this embodiment, the processor module 4 has a top wall 18 that is substantially identical to the top wall 18 of the components 10 as illustrated in detail by FIGS. 3–4. The processor module bottom wall 19, however, is preferably adapted for support on a base such as a table or desktop, and does not comprise a female cavity like the female cavity 20 illustrated in FIG. 4 of the components 10. Because the processor module is the preferred underlying base to the stacked components, it will not require connection to components below it. Its bottom wall may be adapted to support on a flat base by provision of "legs" that preferably provide for electrical insulation, vibration absorption, and low-slippage. By way of example, a plurality of rubber or similar material pads may be provided.

Just as the processor module 4 is the preferred underlying base to the stacked components 10, the monitor 14 is the preferred uppermost element to the stacked system. Accordingly, it is preferably provided with a bottom wall 22 that is substantially identical to the bottom wall 22 of the components 10 as illustrated in FIG. 4. That is, the monitor component 14 is preferably stacked on top of a modular component 10 and accordingly has a bottom wall 22 adapted for receiving the top wall 18 of the modular component 10. Because no components are stacked on top of the monitor 14 as illustrated in FIGS. 1–2, however, its top wall 21 does not comprise connector means and is preferably "closed".

Although FIGS. 3–4 illustrate a single stackable component 10, the top wall 18 of the component 10 will be appreciated to be substantially identical to the top wall 18 of all of the components 10 and the processor module 4. Likewise, the bottom wall 22 of the component 10 as illustrated in those FIGS. will be appreciated to be substantially identical to the bottom wall 22 of all of the components and of the monitor unit 14.

Now referencing those FIGS. 3–4, the male connector member 16 on the top wall 18 preferably comprises a raised perimeter that surrounds a male communications connector 28 and a male power connector 30. A preferred communications connector 28 comprises a serial connector such as a universal serial bus ("USB") connector or an IEEE 1394 protocol connector having exposed conductive elements on a male extension. These preferred connector members are generally known in the art and are commercially available. A preferred power connector 30 comprises at least two conducting elements 32 for connecting AC power, and more preferably comprise a third conducting element for connection to a ground.

While the structure of the power connectors is exemplary, it should be understood that the design of must comply with electrical codes, underwriting authorities such as Underwriter's Laboratory, and/or other applicable standards.

FIG. 4 shows in dashed a mating female cavity 20 on the bottom wall 22 that is adapted to receive the male connector member 16. In particular, the male connector member 16 preferably is tapered to narrow from its base 24 to its raised distal end 26. The tapered shape of the member 16 and cooperating mating shape of the cavity 20 help to guide the connectors into operable connection with one another during stacking of the components. Within the cavity 20 are a female power connector 34 for receiving the male power connector 30 and a female USB connector 36 for receiving the male USB connector 28.

FIGS. 2–4 illustrate each of the stackable components 10 and the processor module 4 having a plurality of male structural connectors 38 on their top walls 18. Each of the stackable components 10, as well as the monitor 14, have mating female receptacles 40 for receiving the male structural connectors 38. As best illustrated by FIGS. 3–4, the preferred structural male connector 38 is tapered to narrow from its base 42 to its top distal end 44. The mating female cavity 40 is shaped in a corresponding manner to receive the connector 38. Such a tapered shape helps to guide the connectors 38 easily into mating connection in the female receptacles 40. Although four connectors 38 are illustrated, it will be appreciated that any number from one to a multiplicity of connectors may be comprised.

A plurality of connectors is preferred for structural integrity of the stacked system. Additionally, the structural connectors are preferably positioned so that they help to guide the communications and power connectors into operable connection. To accomplish this, the preferred male structural connectors 38 have a height that is greater than the communications connector 16. That is, the male structural connectors 38 preferably have a top distal end 44 that is raised from the top wall 18 by a distance that is greater than the distance that separates the connector top distal end 26 from the top wall 18. In addition, it may be desired to shape the mating structural connectors such that a small distance is maintained between stacked components to allow for airflow and resultant cooling of the component.

Figure 5:
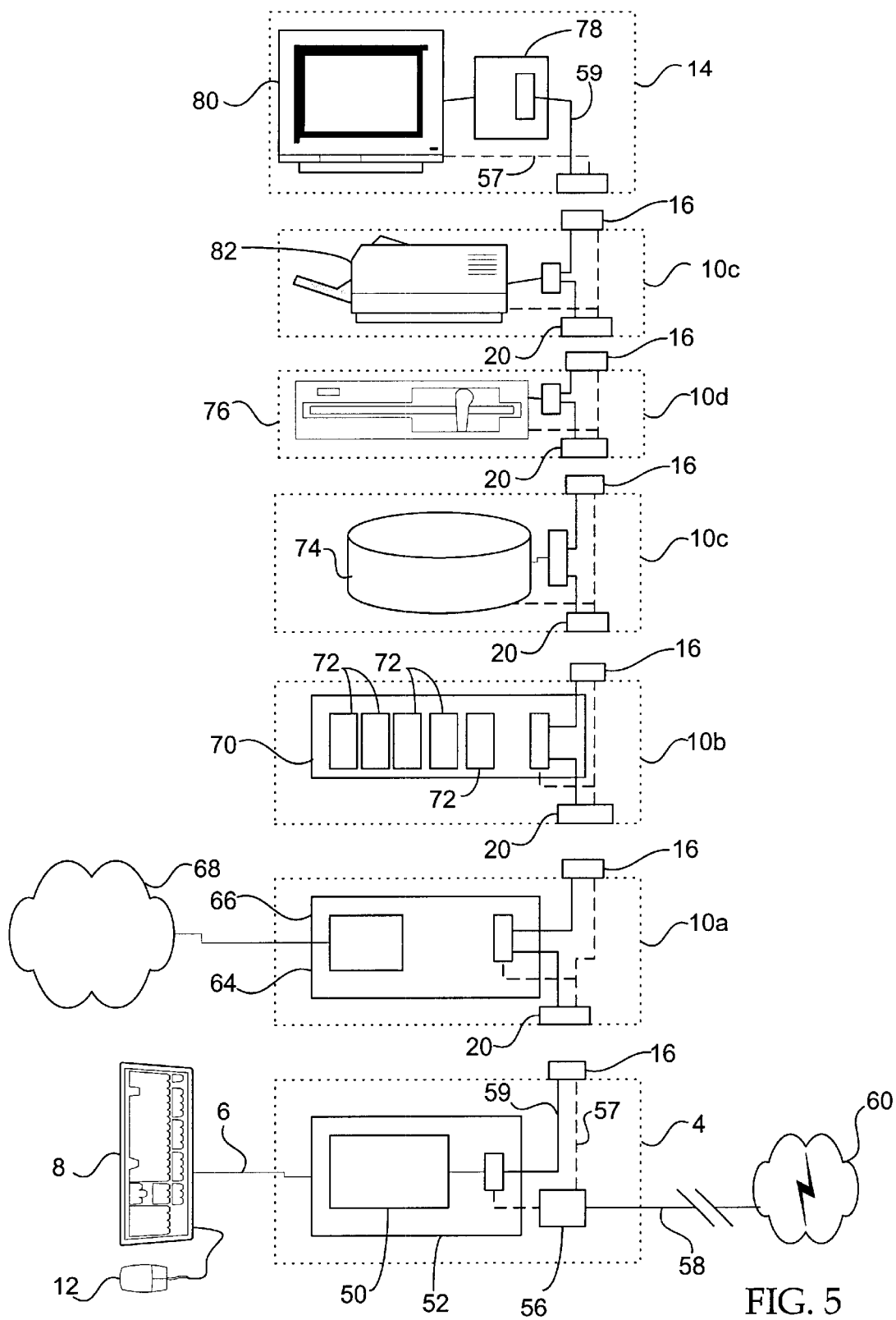
FIG. 5 is a schematic diagram of a portion of the circuitry and components of a modular computer system embodiment of the invention.

In order to better describe the operational connections of an embodiment of the modular system of the invention, the schematic of FIG. 5 illustrates the general circuitry of the embodiment of the modular computer system 2 illustrated in FIGS. 2–4 of the invention. The processor module 4 (outlined in dashed) comprises a central processor unit ("CPU") 50 that is connected to a circuit that preferably comprises a printed circuit card "motherboard" 52. The connector 54 links the circuit card 52 and the CPU 50 to the USB connector 28 (not shown in FIG. 5) within the male connector member 16.

The processor module 4 further comprises a power supply module 56 that is in turn linked to the power connector 30 (not shown in FIG. 5) within the connector member 16, and may also be linked to the motherboard 52 for powering the CPU 50 or for other power requirements. It is noted that for clarity the power linkages 57 in FIG. 5 are illustrated with a dashed line, while the communications linkages 59 are shown with a solid line. The power supply module 56 preferably supplies various outputs such as 120 V AC and/or 12 V DC power for example. The power supply 56 is connected via lines 58 to an AC power supply 60. Also, the processor module 4 has a linkage 6 for connecting the motherboard 52 to the keyboard 8 and the mouse 12.

Preferably, the CPU 50 comprises an industry standard personal computer CPU as are commercially available, such as a Pentium series chip from the Intel Corp. or the like. Likewise, the printed circuit card 52 preferably comprises a PCI bus motherboard architecture as is widely commercially available, and the power supply module 56 comprises a commercially available standard component. Using standard components provides advantages in terms of cost and interoperability.

Each of the plurality of modular components 10 stacked vertically upon the processor module 4 will be linked thereto for receiving power signal and communications signals via the male connectors 16 mated with the female cavities 20. It will be appreciated that although not illustrated in the schematic of FIG. 5, the male connectors 16 may further comprise the male serial connector 28 and the male power connector 30, and that the female cavity 20 may further comprise the corresponding serial connector 36 and the power connector 34.

The modular component 10a illustrated above the communications module 4 in FIG. 5 comprises, for example purposes a network/communications module 10a. The female cavity connector 20 links the communications and power signals via the connector 62 to a networking card 64. A bus board 66 is further comprised to facilitate the connection. An external network 68 may then be linked to the system 2. The network card 64, bus board 66, and other components that may be comprised in the modular networking component 10a preferably comprise industry standard and widely available components for achieving cost and interoperability advantages.

The modular component 10b stacked above the networking component 10a in the schematic of FIG. 5 comprises a modular memory component. Accordingly, a circuit card 70 is provided with one or a plurality of memory chips 72 connected thereto. Above the memory component 10b in FIG. 5 is a hard drive component 10c, which comprises a hard drive 74 having power and communications connections. The modular component above the component 10b in FIG. 5 comprises an external disk read/write module 10d that has a disk drive 76, which may for example comprise a CD read/write drive. The disk drive 76 has power and communications connections. As with other components in the system 2, widely commercially available and industry standard components are preferred for the disk drive 76, the hard drive 74, the circuit card 70, the memory chips 72, the video card 78, and the screen 80 for cost and interoperability advantages.

The modular component 10e in the schematic of FIG. 5 comprises a printer component. It generally comprises a printer engine module 82 linked to the communications and power circuits via the female connector cavity 20. Ass will be appreciated by those knowledgeable in the art, the printer engine module 82 comprises componentry for copying an image from an original document and depositing a reproduction of the image on a second document. The engine module 82 has been illustrated in the schematic of FIG. 5 as a printer for convenience. The engine module 82 in practice may actually comprise such components as a sheet feeding and handling mechanism, a photo static, photoelectric, or like image copying and depositing mechanism, a paper supply, and the like. Those skilled in the art will appreciate that these components are generally known and a more detailed description herein is therefore not presented. The uppermost component in the schematic of FIG. 5 comprises a monitor component 14. The communications signal 59 is linked through a video card 78 to a screen 80, which is also linked to the power signal 57.

It will be appreciated that the schematic of FIG. 5 is provided for teaching of the basic modularity of an embodiment of the invention only, and may comprise additional circuitry and componentry than that illustrated. Indeed, those knowledgeable in the art will appreciate that various of the power connections, communications connections, and internal components illustrated in the various modular components 10 may be achieved in many different manners, and may readily be configured differently than illustrated. Further, a number of additional or different modular components 10 may be present in other embodiments of the system 2. By way of example, modular components may comprise a sound card component, scanner component, gaming component, and the like.

It will be appreciated that it may be more convenient to have a printer modular component as the uppermost component of the vertically stacked components for the reason that access to the top of the printer component may be desirable. Likewise, having a modular monitor component located at a lower position within the vertically stacked system may be desirable for some users.

An advantage of the modular system 2 embodiment of the invention is that each modular component may advantageously leverage other modular components to reduce the number of internal components required for operation. For example, the printer component 10e may utilize the CPU 50 and the power supply 56 available via the signals 59 and 57, respectively, for processing and power needs. Additionally, memory requirements for the printer component 10e may be provided for by utilizing the modular memory component 10b. It will be appreciated that the leveraging of other system modular components may be possible for other peripherals such as the disk drive component 10d, monitor component 14, hard drive component 10c, memory component 10b, networking component 10a, as well as other modular components not shown such as scanner modules, sound card modules, and the like. In this manner the modular system 2 of the invention advantageously may provide modular components at a lower cost and simpler design than was possible with many stand alone peripherals of the prior art.

The modular system of the invention is preferably configured to operate with a standard personal computer operating system such as Windows available from the Microsoft Corporation, Redmond, Wash. To be functionally operable with a standard operating system, the modular system may require the presence of several modular components of the system. For example, to operate with a Windows operating system the modular system of the invention may require a processor component, a memory component, a hard drive component, and a monitor component. The modular components of the system of the invention preferably support so-called "plug and play" functionality, so that any modular components operably connected will be automatically recognized by the operating system. Those knowledgeable in the art will appreciate that other embodiments of the system of the invention are of course capable of operation with other operating systems.

The monitor component 14 of the embodiment illustrated in FIGS. 1–5 is vertically stacked on the plurality of modular components 10, as best illustrated by FIG. 1. Other system embodiments may feature different monitor configurations, however. By way of example, reference is made to the modular system 100 of FIG. 6, which comprises a stackable video card component 102 with a monitor support arm 104 connected thereto. A monitor 106 is supported on the arm 104. Preferably, the monitor 106 comprises a "flat screen" monitor that is movable about the arm 104 both in a horizontal pivotal direction as indicated by the arrow 108 and in a vertically pivotal direction as indicated by the arrow 110. The monitor 106 is further preferably movable vertically along the support arm 104. Finally, the support arm 104 and a monitor attachment bracket 112 are preferably adapted to provide power and communications signals to the monitor 106 such that external wiring or cabling is not required.

Figure 7:
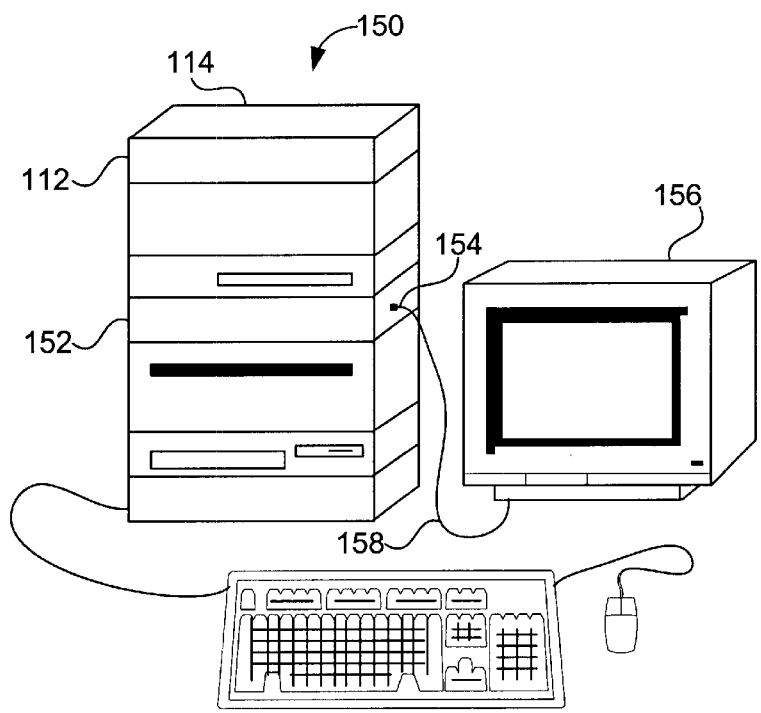
FIG. 7 is a perspective view of an additional embodiment of a modular computer system of the invention with a non-stacked monitor module.

An additional embodiment 150 of the modular computer system of the invention featuring an external monitor configuration is shown in FIG. 7. In particular, the stackable video card component 152 comprises a connection 154 for connecting to a standard monitor device 156 via a standard cable 158. While the system embodiment 150 may be less preferred than the embodiments 100 and 2 because of its larger footprint, it may be of use to take advantage of industry standard monitor devices.

Figure 6:
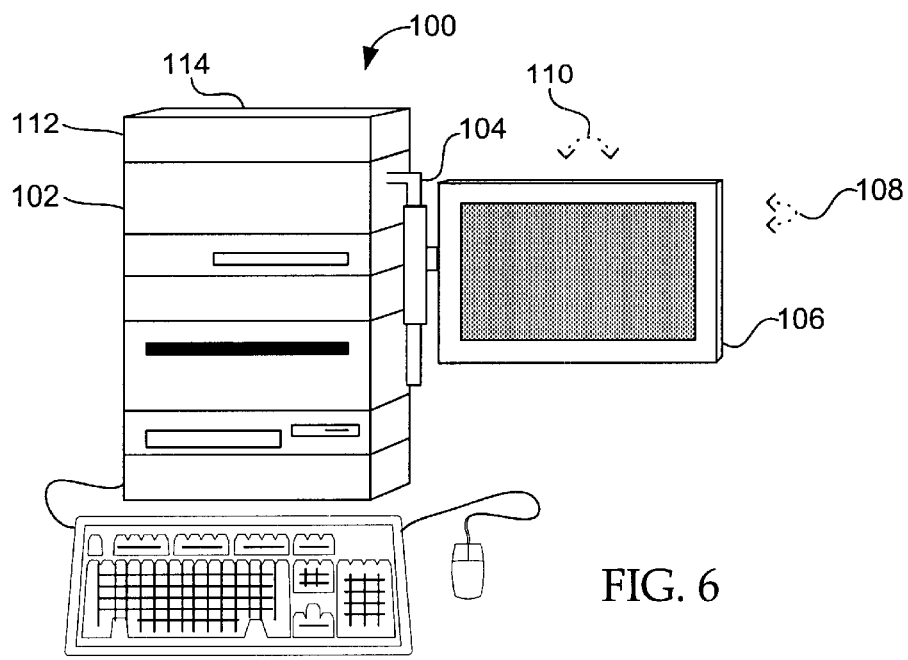
FIG. 6 is a perspective view of an additional embodiment of a modular computer system of the invention with a non-stacked monitor module.

It is noted with reference to the system embodiments 100 and 150 of FIGS. 6 and 7 respectively, that the video card modules 102 and 152 are among the stacked components, with other components being operably stacked above them. It will thus be appreciated that the system of the invention is not limited to having the monitor as residing on top of the stacked components. Further, the systems 102 and 152 of FIGS. 6 and 7 illustrate an uppermost component 112 with a substantially closed and flat top wall 114. This component may comprise a non-operable "cap" element configured only to protectively cover the male connector member 16 and the male structural connectors 38 of the stacked component just below it. Alternatively, the modular component 112 may comprise a functional component provided with a flat and closed top wall 114 designed to be the uppermost stacked component.

It will be appreciated that the various embodiments of the modular system of the invention provide many additional advantages for manufacturers of computer systems and peripherals. For example, in addition to ease of connection, replacement, resource sharing, and space saving advantages, the system also provides an opportunity to capture a consumer's "after-market" purchases. That is, once the consumer has purchased a stackable processor module 4, he is committed to using additional stackable components for peripheral and functional components such as printers, monitors, hard drives and the like.

Figure 8:
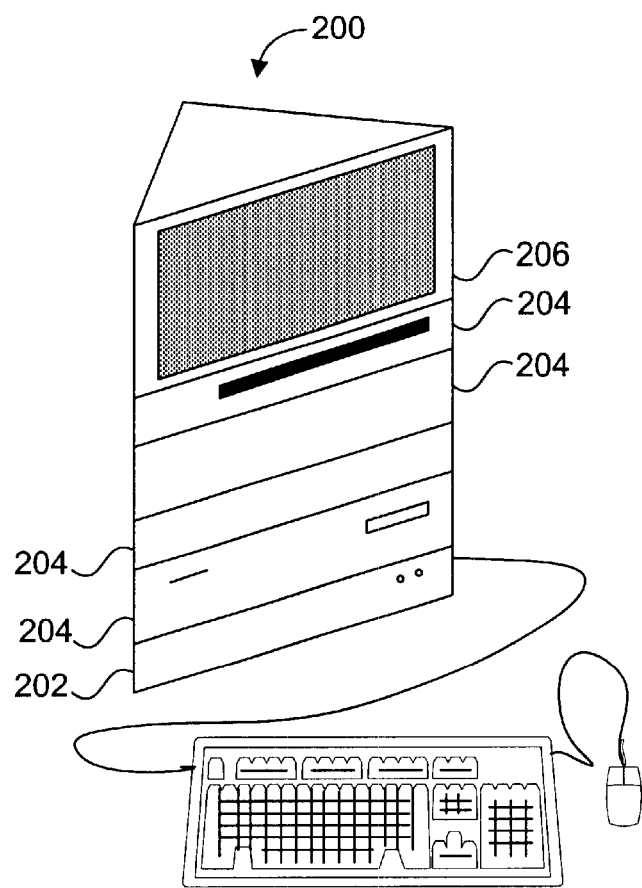
FIG. 8 is a perspective view of a triangular shaped embodiment of a modular computer system of the invention.
Figure 9:
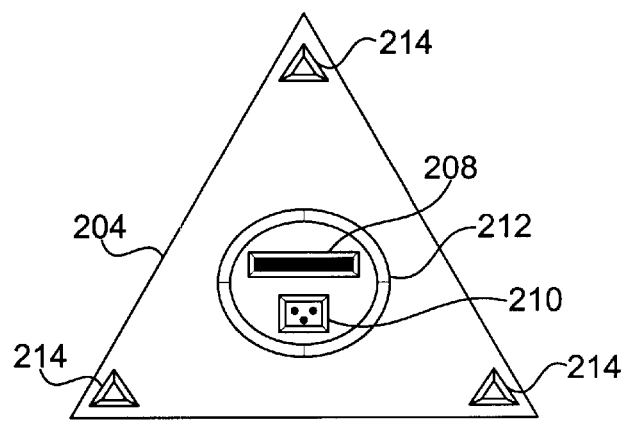
FIG. 9 is a top plan view of a modular stackable component of the triangular shaped embodiment of a modular computer system of the invention.

In addition, it will be appreciated that the modular system of the invention can be configured in any of a number of attractive shapes that may provide marketing advantages to the system. By way of example, FIG. 8 is a perspective view of an embodiment of a modular system 200 of the invention with a processor module 202, a plurality of stackable components 204, and a monitor 206 in a substantially triangular shape. FIG. 9 is a top plan view of one of the stackable components 204, with a communications connector 208 and a power connector 210 within the perimeter of a circular tapered connector member 212, and a plurality of tapered structural male connectors 214. The bottom wall of the component 204 comprises corresponding female connector members shaped to receive the male connectors. It will thus be appreciated that the stacked components 204 may be operably connected to one another, to the processor module 202, and to the monitor 206 by mating male and female connector sets as generally described with reference to the system 2 and illustrated in FIGS. 2-4.

Figure 10:
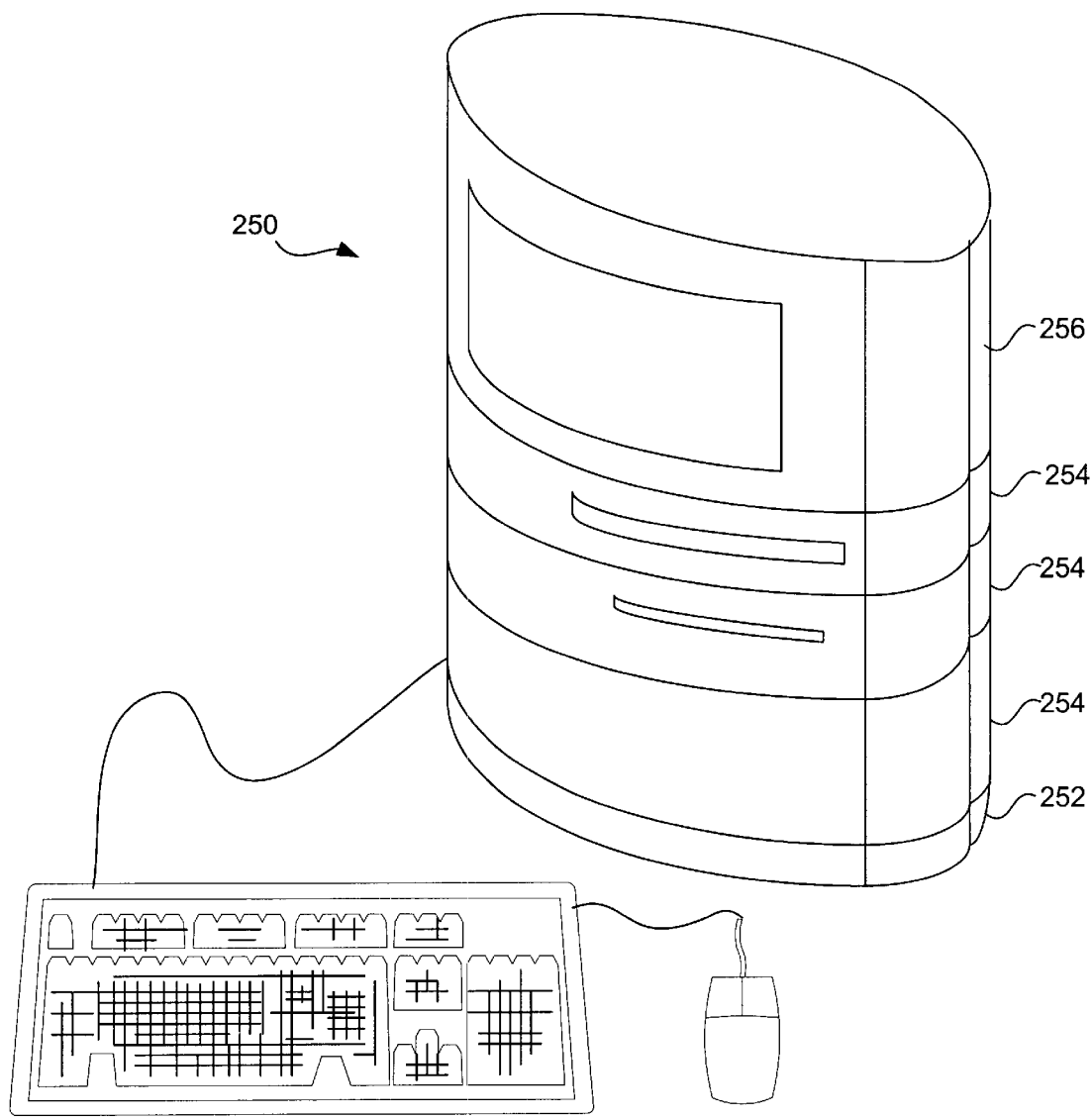
FIG. 10 is a perspective view of an elliptical shaped embodiment of a modular computer system of the invention.
Figure 11:
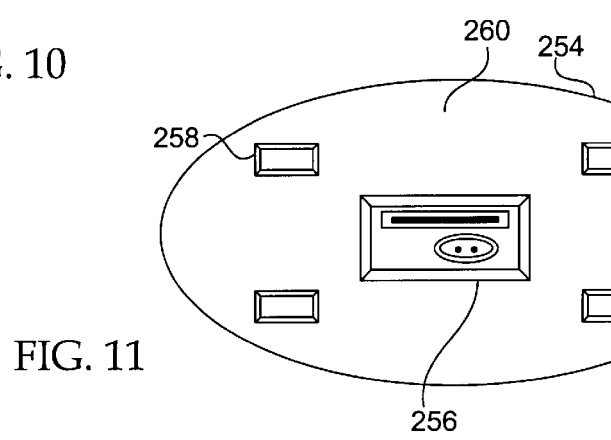
FIG. 11 is a top plan view of one of the elliptical shaped modular components of the system of FIG. 10.

By way of additional example, reference is made to the elliptical shaped modular system 250 of FIGS. 10 and 11. A processor module 252 underlies a plurality of stacked components 254 and a monitor 256. The top plan view of one of the components 254 shown in FIG. 11 illustrates a connector member 256 and a plurality of male structural connectors 258 on the component top wall 260. It will be appreciated that the bottom wall of the component 254 comprises corresponding female connectors adapted to receive the connector member 256 and the structural connectors 256. It will further be appreciated that the plurality of components 254, the processor 252, and the monitor 256 can be operably connected to one another in the manner as described with reference to the system 2 and FIGS. 2–4.

With reference to various of the elements of the elliptical shaped system 250 and the triangular shaped system 200, it is noted that the connector member 212, the plurality of structural male connectors 214, and the plurality of structural male connectors 258 are configured differently than the connector member 16 and male connectors 38 of system 2. In particular, the male connectors 214 are generally triangularly shaped, the male connectors 258 are generally rectangularly shaped, and the connector member 212 is generally circularly shaped. Indeed, it will be appreciated that a wide variety of connector configurations may be comprised in addition to those illustrated. Further, although a tapered shape is preferred, it will be appreciated that non-tapered shapes may likewise be practiced.

Those knowledgeable in the art will understand that any number of a multiplicity of structural, communications, and power connection means may be practiced within the invention as claimed. It is preferred that the communications connection means comprise a configuration where devices are operably linked to the processor component in series through connection to other components. A preferred connection architecture comprises serial connections such as the USB or IEEE 1394 connections as they support very rapid data transfer and many components in series. Those knowledgeable in the art will appreciate that many other connection architectures may be practiced within the system of the invention as claimed. By way of example, SCSI connections are known, but are more limited than USB and 1394 standards in that only seven devices in series may be connected, and data transfer rates are much slower. Other connection architectures may of course be used within the scope of the invention as claimed.

The plurality of stackable components within an embodiment of the system of the invention may comprise any of a number of functional components. Indeed, it will be appreciated that one of the advantages of the present invention is its modularity, and that the modular components 10 can be easily added or changed out of the system. Preferably, the stackable components 10 comprise peripherals such as printers, scanners and the like, as well as functional elements of personal computer system such as a hard drive, memory such as random access memory ("RAM"), a sound card, a networking/communications card, a drive for reading or writing to portable disks such as optical or magnetic disks, and the like. In particular, preferred stackable components include, but are not limited to, a laser printer component, an inkjet printer component, a scanner component, a hard drive component, a random access memory component, a sound card component, a network/communications component, a video card component, and a portable disk read/write component It will be appreciated that a modular computer system of the invention with its components that are easily connected through vertical stacking achieves important advantages in terms of replacing functional components. By way of example, a user who needs to add memory to his computer system does not need to operate on the inner workings of the computer and replace chips or otherwise deal with the inner circuitry of a computer. Instead, the user may simply add a stackable memory component 10 to his modular system, or replace an existing memory component 10 with a more capable component. Similar advantages of course exist for changing hard drives, sound cards, and other componentry.

An additional advantage of the modular system of the invention is the relatively small footprint achieved by arranging peripherals in a vertically stacked configuration. Accordingly, the preferred stackable components 10 will comprise peripheral devices such as a laser or inkjet printer. These components will of course require paper input and output, which may be accomplished by use of trays or drawers as is generally known. Because the modular components 10 are stacked, access to the top walls thereof is of course not available. Thus the modular printers and scanners of the invention may have paper input and output means such as drawers, trays, and the like accessible on their front or sidewalls.

It will be appreciated that the invention as claimed may be practiced in a wide variety of embodiments other than those illustrated herein. For instance, those knowledgeable in the art will appreciate that a multiplicity of additional connection means could be used for connecting power and communications signals, and for structural connectors. By way of a first example, the order of male and female connectors could be easily changed herein. That is, female connectors could be comprised on component top walls and male connectors on bottom walls. Additionally, some connector means on a top or bottom wall could comprise male connector means while others comprised female connector means.

By way of a second example, a variety of connection means in addition to male and female connector sets could be practiced within the scope of the claimed invention. For instance, substantially flat contact connectors or the like could be used to connect communications and power signals between components. Structural connector means could comprise adhesive strips, mating hook and loop fabric strips, movable locking connectors, or the like.

Further, the functional connector means discussed herein could be combined. That is, a single connection means may combine the function of structural and power connectors, may combine the function of structural and communications connectors, or may combine the function of power, communications, and structural connectors. Also, the modular system of the invention may be provided in any number of shapes as may be desired for marketing or other purposes. Although examples such as rectangular, elliptical, and triangular have been presented, other shapes may include, but are not limited to, squares, hexagons, pentagons, ovals, circles, and the like.

It will also be understood that although modular computer system embodiments have been herein described, the present invention is not limited to practice as a modular computer system. Indeed, those skilled in the art will appreciate that the advantages of the modular processor based system as claimed will have value in a multiplicity of potential embodiments. These embodiments may include, but are not limited to, processor based computer peripherals such as copy machines, printers, scanners, and the like; processor based machine tools; processor based cash registers and order entry terminals; network equipment such as routers, gateways and the like; and processor based communications equipment such as switches and the like.

The advantages of the disclosed invention are thus attained in an economical, practical, and facile manner. While preferred embodiments and example configurations have been shown and described, it is to be understood that various further modifications and additional configurations will be apparent to those skilled in the art. It is intended that the specific embodiments and configurations herein disclosed are illustrative of the preferred and best modes for practicing the invention, and should not be interpreted as limitations on the scope of the invention as defined by the appended claims.

What is claimed is:

1. A modular processor based apparatus comprising:
 a processor module having a top wall and a bottom wall, a communications port on at least one of said top or bottom walls, said processor module comprising at least a central processor unit;
 a plurality of modular components, said components being interchangeably and vertically stacked on one another and with said processor module, said components each having a top wall and a bottom wall, said modular components each having mating communications connectors on said top and bottom walls adapted for connecting to other of said components whereby said components being operably connected to one another though vertical stacking, at least one of said mating connectors adapted for connection to said processor module communications port whereby each of said stacked components being operably linked to said processor module when said components are stacked with said processor module;

wherein one of said plurality of components comprises a video card unit for connection to a monitor, wherein said video card unit has a monitor support arm for supporting a monitor, said monitor support arm comprising power and communications connectors for said monitor.

2. The modular processor based apparatus as defined by claim 1 wherein said processor module communications port is on said top wall of said processor module, and wherein said processor module has said bottom wall adapted for placement on a support, whereby said plurality of stackable modular components may be stacked vertically on top of said processor module with said communications connector on a bottom wall of a lowermost of said plurality of interchangeably stacked components being operably connected to said processor module communications port.

3. A modular processor based apparatus as defined by claim 1 wherein each of said plurality of components further comprise mating structural connectors on each of said component top and bottom walls for connection to one another through stacking of said components on one another, and wherein said processor module has a structural connector on at least one of said top or bottom walls.

4. A modular processor based apparatus as defined by claim 3 wherein said mating structural connectors comprise a plurality of male structural members on one of said top or bottom walls, and a cooperating plurality of female receptacles for receiving said male members on the other of said top or bottom walls.

5. A modular processor based apparatus as defined by claim 4 wherein each of said plurality of male structural members components has a base proximate said component and a distal end, each of said male structural members being tapered to narrow from said base to said distal end, and wherein each of said plurality of cooperating female members having a cavity shape adapted to receive said tapered male structural member.

6. A modular processor based apparatus as defined by claim 1 wherein said processor module has a first power connector for connection to a power source and has a second power connector on one of said top or bottom walls, and wherein each of said modular components further comprises mating power connectors on said top and bottom walls, at least one of said component mating power connectors adapted for mating with said processor second power connector, whereby said modular components and said processor module being operably connected to a power source when vertically stacked with one another.

7. A modular processor based apparatus as defined by claim 6 wherein said mating power connectors comprise mating male and female connectors.

8. A modular processor based system as defined by claim 1 wherein the system further comprises a monitor unit having a screen and a bottom wall, said monitor unit stackable vertically on top of said plurality of stacked components, said monitor unit bottom wall having a communications connector adapted for connection to said mating communications connector on said top wall of the uppermost of said plurality of stacked components, said monitor unit thereby being linked to each of said plurality of stacked components and to said processor module.

9. A modular processor based apparatus as defined by claim 1 wherein said processor module and each of said modular components has a shape that substantially comprises one chosen from the group consisting of: rectangular, square, triangular, pentagon, hexagon and oval.

10. A modular processor based apparatus as defined by claim 1 further comprising an uppermost component having a closed top wall.

11. A modular processor based apparatus as defined by claim 1, wherein said plurality of stackable components comprise at least: a hard drive component, a memory component, and a disk drive component.

12. A modular processor based apparatus as defined by claim 1 wherein each of said modular component mating communications connectors and said processor module communications port comprise universal serial bus connectors.

13. A modular processor based apparatus as defined by claim 1 wherein said processor module further comprises at least a circuit board having a universal serial bus port connected to said communications port.

14. A modular computer system comprising:

a processor module comprising a central processor unit, a power supply and a mother board, said processor module having a bottom wall adapted for support on an underlying flat base, said processor module having a top wall with a communications port, a power connector and a plurality of structural connectors;

a modular hard drive component having a memory component for storing data, said hard drive component having a top and a bottom wall, each of said top and bottom walls having a communications connector, power connector and a plurality of structural connectors;

a modular memory component comprising a random access memory component, said modular memory component having a top and a bottom wall, each of said top and bottom walls having communication connector, power connector and a plurality of structural connectors;

a modular network communications component comprising a network communications circuit for communicating with an external network, said network communications module having a top and a bottom wall, each of said top and bottom walls having communication connectors, power connectors and a plurality of structural connectors;

a monitor unit having a bottom wall with communications connectors, power connectors and a plurality of structural connectors;

wherein said modular memory component, said modular network communications component and said modular hard drive component are all interchangeably stacked vertically with one another, said stacked modular components being operably linked to one another by mating of respective of said power connectors, said communications connectors and said stacked modular components being structurally linked by mating of said structural connectors;

a modular printer component, said printer component having a top and a bottom wall, each of said top and bottom walls having a communication connector, a power connector and a plurality of structural connectors;

a modular sound card component, said sound card component having a top and a bottom wall, each of said top and bottom walls having a communication connector, a power connector and a plurality of structural connectors;

a modular scanner component, said scanner component having a top and a bottom wall, each of said top and bottom walls having a communication connector, a power connector and a plurality of structural connectors; and, wherein said modular scanner component, said modular printer component, and said modular sound card component are vertically interchangeably stacked with said plurality of stacked components, said modular scanner component, modular printer component and said sound card component thereby being operably linked to one another, to said processor module and to said monitor unit by mating of respective of said power connectors, said communications connectors, and said structural connectors;

said stacked components stacked on top of said processor module top wall, said monitor unit stacked on top of said stacked modular components, whereby said bottom wall of a lowermost of said stacked components lying on top of said processor module top wall with said plurality of processor module structural connectors, communications connector, and power connector being operably mated with respective of said bottom wall power connectors, communication connectors and power connectors, said plurality of stacked components thereby operably linked to said processor module; and, said monitor unit stacked on top of said plurality of stacked components whereby said monitor unit bottom wall lying on top of said top wall of an uppermost of said plurality of stacked components, with said monitor unit bottom wall power connectors, communication connectors, and structural connectors being in mating connection with respective of said uppermost stacked component top wall power connector, communications connector, and structural connectors whereby said monitor unit thereby being operably linked to said plurality of stacked components and to said processor module.

15. A modular computer system as defined by claim 14 wherein said communication connectors, power connectors and structural connectors provided on said hard drive unit top and bottom walls, said memory unit top and bottom walls, and said communications unit top and bottom walls comprise mating male and female connector sets.

16. A modular computer system as defined by claim 15 wherein said mating male and female connector sets comprise male members tapered to narrow from a base to a distal end and female members shaped to fit said tapered male members.

17. A modular computer system as defined by claim 14 wherein said system further comprises:

a modular printer component, said printer component having a top and a bottom wall, each of said top and bottom walls having a communication connector, a power connector and a plurality of structural connectors;

a modular sound card component, said sound card component having a top and a bottom wall, each of said top and bottom walls having a communication connector, a power connector and a plurality of structural connectors;

a modular scanner component, said scanner component having a top and a bottom wall, each of said top and bottom walls having a communication connector, a power connector and a plurality of structural connectors; and, wherein said modular scanner component, said modular printer component, and said modular sound card component are vertically interchangeably stacked with said plurality of stacked components, said modular scanner component, modular printer component and said sound card component thereby being operably linked to one another, to said processor module and to said monitor unit by mating of respective of said power connectors, said communications connectors, and said structural connectors.

18. A modular computer system comprising:

a processor module having a bottom wall adapted for support on an underlying flat base, and a top wall with a communications port, a power connector and a plurality of structural connectors;

a monitor unit having a bottom wall with communications connectors, power connectors and a plurality of structural connectors;

a modular printer component having a top and a bottom wall, each of said top and bottom walls having a communication connector, a power connector and a plurality of structural connectors; and a modular scanner component having a top and a bottom wall, each of said top and bottom walls having a communication connector, a power connector and a plurality of structural connectors;

wherein said modular scanner component and said modular printer component are vertically stacked and operably linked to one another, to said processor module and to said monitor unit by mating of respective ones of said power connectors, said communications connectors, and said structural connectors.

19. A system as defined in claim 18 wherein said stacked printer and scanner components are stacked on top of said processor module top wall and said monitor unit is stacked on top of said stacked modular components, whereby said bottom wall of a lowermost of said stacked components lying on top of said processor module top wall with said plurality of processor module structural connectors, communications connector, and power connector being operably mated with respective of said bottom wall power connectors, communication connectors and power connectors, said plurality of stacked components thereby operably linked to said processor module.

\* \* \* \* \*